(12) United States Patent
Shen et al.

(10) Patent No.: US 10,128,876 B2
(45) Date of Patent: Nov. 13, 2018

(54) EFFICIENT OUTPUT POWER COMBINING DIGITAL MICROWAVE RADIO SYSTEM

(71) Applicants: ZTE CORPORATION, Shenzhen (CN); Ying Shen, Chapel Hill, NC (US)

(72) Inventors: Ying Shen, Chapel Hill, NC (US); Andrey Kochetkov, Cary, NC (US); Aleksandr Semenyshev, Apex, NC (US); Shawn Walsh, Cary, NC (US); Thanh Hung Nguyen, Cary, NC (US)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/537,803

(22) PCT Filed: Oct. 27, 2015

(86) PCT No.: PCT/US2015/057622
§ 371 (c)(1),
(2) Date: Jun. 19, 2017

(87) PCT Pub. No.: WO2016/099661
PCT Pub. Date: Jun. 23, 2016

(65) Prior Publication Data
US 2017/0353200 A1 Dec. 7, 2017

Related U.S. Application Data

(60) Provisional application No. 62/094,232, filed on Dec. 19, 2014.

(51) Int. Cl.
*H04B 1/04* (2006.01)
*H03F 1/32* (2006.01)
(Continued)

(52) U.S. Cl.
CPC ......... *H04B 1/0483* (2013.01); *H03F 1/3247* (2013.01); *H03F 3/19* (2013.01);
(Continued)

(58) Field of Classification Search
CPC .... H03F 1/3241; H03F 1/3247; H04B 1/0483
See application file for complete search history.

(56) References Cited

U.S. PATENT DOCUMENTS 5,222,246 A 6/1993 Wolkstein
6,799,020 B1 9/2004 Heidmann et al.
(Continued)

FOREIGN PATENT DOCUMENTS

EP 0602952 A2 6/1994
EP 1345321 A1 9/2003

OTHER PUBLICATIONS

ZTE Corporation, International Search Report and Written Opinion, PCT/US2015/057622, dated Mar. 2, 2016, 10 pgs.
(Continued)

*Primary Examiner* — Ross Varndell
(74) *Attorney, Agent, or Firm* — Morgan, Lewis & Bockius LLP

(57) ABSTRACT

A digital microwave radio system includes a splitter that splits a common baseband input into two baseband outputs, first and second transmitters, each transmitter electrically connected to a baseband output of the splitter via a mixer, a common local oscillator electrically connected to the mixer of the first transmitter and the mixer of the second transmitter via an adjustable phase shifter, respectively, and a combiner. The common local oscillator is configured to up-convert each baseband output into a radio-frequency signal using a corresponding mixer. The combiner combines the two radio-frequency signals into a 0-degree phase-shift output and a 180-degree phase-shift output, respectively. A
(Continued)

phase error control loop adjusts the phase shifter to minimize the 180-degree phase-shift radio-frequency output. A combiner gain control loop adjusts the output power level of the two transmitters in accordance with an actual power detector reading at the 0-degree phase-shift radio-frequency output.

14 Claims, 5 Drawing Sheets

(51) Int. Cl.
  *H03G 3/30* (2006.01)
  *H03F 3/19* (2006.01)
  *H04W 52/52* (2009.01)
  *H04L 25/02* (2006.01)

(52) U.S. Cl.
  CPC .......... *H03G 3/3042* (2013.01); *H04L 25/02* (2013.01); *H04W 52/52* (2013.01); *H03F 2200/451* (2013.01); *H03F 2200/465* (2013.01); *H04B 2001/0425* (2013.01)

(56) References Cited

U.S. PATENT DOCUMENTS

| | | | |
|---|---|---|---|
| 8,355,682 B2 | 1/2013 | Kenington | |
| 8,766,718 B2 | 7/2014 | Matsumoto et al. | |
| 2003/0129955 A1* | 7/2003 | Gilmore | H03D 7/166 455/303 |
| 2003/0228854 A1 | 12/2003 | Morris et al. | |
| 2004/0092245 A1* | 5/2004 | Katz | H03D 9/0633 455/326 |
| 2004/0196921 A1 | 10/2004 | Matsumoto et al. | |
| 2015/0054582 A1* | 2/2015 | Goss | H03F 1/3247 330/279 |
| 2017/0222687 A1* | 8/2017 | Wyville | H04B 1/40 |

OTHER PUBLICATIONS

ZTE Corporation, International Preliminary Report on Patentability, PCT/US2015/057622, dated Jun. 20, 2017, 8 pgs.
ZTE Corporation, Communication Pursuant to Rules 161(2) and 162, EP15870526.9, dated Aug. 10, 2017, 2 pgs.
ZTE Corporation, Extended European Search Report, EP15870526.9, dated Jul. 13, 2018, 8 pgs.

* cited by examiner

US 10,128,876 B2

EFFICIENT OUTPUT POWER COMBINING DIGITAL MICROWAVE RADIO SYSTEM

CROSS REFERENCE TO RELATED APPLICATIONS

This Application is a United States National Stage Application filed under 35 U.S.C. § 371 of PCT Patent Application Serial No. PCT/US2015/057622 filed on Oct. 27, 2015, which claims the benefit of and priority to U.S. Provisional Patent Application No. 62/094,232 filed on Dec. 19, 2014, which is hereby incorporated by reference in its entirety.

TECHNICAL FIELD

The present application relates generally to the field of microwave radio communication equipment and, in particular, to an efficient output power combining digital microwave radio system.

BACKGROUND

In microwave radio communication, higher output power has always been a market requirement for longer distance, higher modulation and higher throughput needs. One way of achieving a higher output power level is to combine two radio-frequency (RF) signals from two channel units into one and keep the two units within the same enclosure to reduce cost, power consumption and size of the field installation. However, there are often small but random frequency and phase offsets between the two channel units, which may cause incoherency between the two respective RF signals. As such, if both channel units were online with the random frequency and phase offsets, each of the two RF signals would be a high level noise to the other one and the receivers on the remote side of the radio link may not be able to recover the transmitted data correctly. Therefore, it is important to improve coherency of the signals in both RF channels in order to achieve high power combining efficiency of such approach.

SUMMARY

Accordingly, the present application is directed to an efficient output power combining digital microwave radio system that substantially obviates one or more problems due to the limitations and disadvantages of the related art.

A first aspect of the present application is a digital microwave radio system. The digital microwave radio system includes a splitter that splits a common baseband input into two baseband outputs; a first transmitter and a second transmitter, each transmitter being electrically connected to a baseband output of the splitter via a mixer; a common local oscillator that is electrically connected to the mixer of the first transmitter and the mixer of the second transmitter via an adjustable phase shifter, respectively, wherein the common local oscillator is configured to up-convert each baseband output of the splitter into a radio-frequency signal using a corresponding mixer; a combiner that combines the two radio-frequency signals into a 0-degree phase-shift radio-frequency output and a 180-degree phase-shift radio-frequency output, respectively; a phase error control loop that adjusts the adjustable phase shifter in accordance with an actual reading of the 180-degree phase-shift radio-frequency output; and a combiner gain control loop that adjusts output power level of the first transmitter and the second transmitter in accordance with an actual power detector reading at the 0-degree phase-shift radio-frequency output.

A second aspect of the present application is a method of performing in-phase combining to radio-frequency signals from first and second transmitters of a digital microwave radio system. Each transmitter is configured to up-convert a baseband signal from a splitter to a corresponding radio-frequency signal and a common local oscillator is electrically connected to a mixer of the first transmitter and a mixer of the second transmitter via an adjustable phase shifter, respectively. The method comprises: adjusting an attenuator of each transmitter using an output power control loop to maintain the transmitter at a predefined output power level; combining the radio-frequency signals from the first and second transmitters using a combiner to generate a 0-degree phase-shift radio-frequency output and a 180-degree phase-shift radio-frequency output, respectively; adjusting a phase of an output signal of the adjustable phase shifter using a phase error control loop until when the output power level of the 180-degree phase-shift radio-frequency output is minimized; and adjusting the predefined output power levels of the first transmitter and the second transmitter, respectively, using a combiner gain control loop until when the output power level of the 0-degree phase-shift radio-frequency output reaches a target output power level.

BRIEF DESCRIPTION OF THE DRAWINGS

The accompanying drawings, which are included to provide a further understanding of the present application and are incorporated in and constitute a part of the specification, illustrate embodiments of the present application and together with the description serve to explain the principles of the present application. In the drawings.

Like reference numerals refer to corresponding parts throughout the several views of the drawings.

DETAILED DESCRIPTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present application and the subject matter may be practiced without these specific details. For example, it will be apparent to one of ordinary skill in the art that the subject matter presented herein can be implemented on any type of all outdoor radios system that include two substantially identical radio units.

In the present application, a new digital microwave radio system and associated output power combining approach are proposed for performing in-phase combination to two RF signals in the two radio units such that both signals are combined into one signal and then transmitted to the receiver on the remote side and no signal is muted. According to the present application, the effective output power of the new digital microwave radio system increases by 6 dB, comparing with traditional Hot Standby approach, when standby transmitter is muted. Note that the efficiency of such output power combining approach depends on at least two factors: (i) the coherence of the two RF signals and (ii) the phase/amplitude balance between these two signals.

Figure 1:
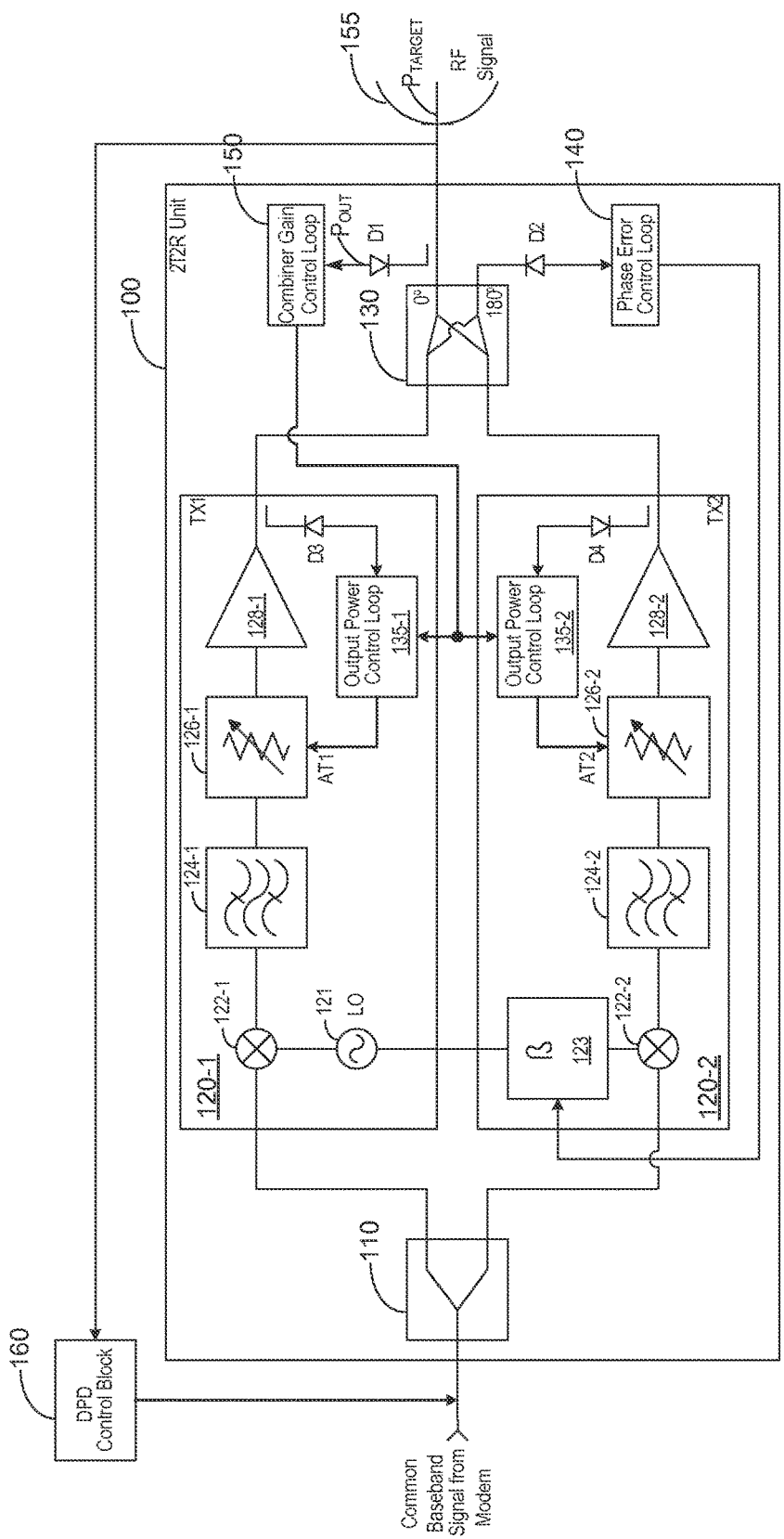
FIG. 1 is an exemplary block diagram illustrating a digital microwave radio system including two radio units that are coupled to one antenna in accordance with some embodiments of the present application.

FIG. 1 is an exemplary block diagram illustrating a digital microwave radio system including two radio units that are coupled to one antenna in accordance with some embodiments of the present application. For illustrative purpose, the system 100 includes two transmitters (120-1, 120-2) for transmitting the user traffic data carried in a common baseband signal to a receiver at the remote side of a radio link, each transmitter (120-1, 120-2) including a mixer (122-1, 122-2), a filter (124-1, 124-2), an attenuator (126-1, 126-2), and an amplifier (128-1, 128-2). One skilled in the art would understand that a microwave transmitter may include other components not depicted in FIG. 1. As shown in the figure, the common baseband signal (i.e., the baseband input) from the modem (not shown) is split into two baseband signals (i.e., the baseband outputs) by the splitter 110. Each baseband signal is then up-converted to a corresponding radio-frequency signal by a transmitter 120-1 or 120-2. After that, the combiner 130 combines the two radio-frequency signals into one signal at the output of the digital microwave radio system 100.

In order to up-convert a baseband signal to a radio-frequency signal, the mixer in each transmitter receives the baseband signal and another signal generated by a local oscillator (LO), which is electrically connected to the mixer, and produces the radio-frequency signal whose frequency is a sum or difference of the two input signals' frequencies. As shown in FIG. 1, a common LO 121 is electrically connected to the mixer 122-1 and the mixer 122-2 (via an adjustable phase shifter 123). This configuration not only improves the coherence of the two combined RF signals over a wide range of environmental conditions but also reduces the cost and overall power consumption of the system 100. Note that the adjustable phase shifter 123 placed into the LO chain with one of the two transmitters can compensate the phase error between the RF signals at the inputs of the combiner 130 up to 360°. Compared with a phase shifter placed in the baseband or RF signal chain, the bandwidth of the phase shifter in the LO chain as shown in FIG. 1 has little impact on the integrity of the RF signals. Because the phase shifter's frequency and phase response characteristics are less critical to the system's overall performance, its manufacturing cost is also lower. As shown in FIG. 1, the radio-frequency signal coming out of the mixer (122-1, 122-2) is then processed by a corresponding sequence of filter, attenuator, and amplifier before it reaches the combiner.

In this example, the combiner 130 has two outputs: one is the combination of the two input RF signals with 0° phase-shift (also known as "in-phase combining") and the other one is the combination of the two input RF signals with 180° phase-shift (also known as "cancellation combining"). As described below, the 180° phase-shift output is more sensitive to the phase error between the two input RF signals of the combiner 130 than the 0° phase-shift output. It can be used as feedback to the phase error control loop 140 to improve the accuracy of phase alignment between the two input RF signals.

One requirement for radio transmitter amplifiers used in a telecommunication system is linearity, i.e., they must accurately reproduce the signal present at their input. An amplifier that has a nonlinear input/output relationship causes the output signal to splatter onto adjacent radio frequencies. This causes interference on other radio channels. But most radio transmitter amplifiers have some degree of non-linear behavior. Predistortion is a technique used to improve the linearity of radio transmitter amplifiers. A predistortion circuit inversely models an amplifier's gain and phase characteristics and, when combined with the amplifier, produces an overall system that is more linear and reduces the amplifier's distortion.

From the perspective of predistortion, the system 100 including the two transmitters (120-1, 120-2) and the combiner 130 is equivalent to a single nonlinear device. Predistortion correction can be applied to the common baseband signal of the entire system 100 before the signal is split into two channels by the splitter 110 using the digital predistortion (DPD) control block 160, which receives the combined output signal (i.e., the 0° phase-shift output) as feedback. This configuration significantly simplifies the implementation of the adaptive DPD control block 160 or reduces the calibration time in case of implementing an open loop DPD control block.

As shown in FIG. 1, the system 100 includes three layers of control loops to combine the in-phase output power from two transmitters with high efficiency and maintain the antenna port 155 at a target output power level with high accuracy the system 100. The first layer of control loops is the output power control loop (135-1, 135-2) within each radio channel, which controls the channel's power stability and dynamic range by adjusting the attenuator (126-1, 126-2) in accordance with an actual reading of the power detector D3/D4 after the amplifier (128-1, 128-2) and an output of the combiner gain control loop 150. Note that the two output power control loops are independent from each other. The second layer of control loop is the combiner gain control loop 150 for controlling the efficiency of the power combining at the combiner 130 and its stability over temperature, frequency, power range and various configurations (modulation, bandwidth, throughput, etc.). The third layer of control loop is the DPD control block 160 for controlling the digital predistortion capability with the combined RF signal over temperature, frequency, power range and various configurations. A more detailed description of the three layers of control loops is provided below in connection with FIGS. 2 and 3, respectively.

Figure 2:
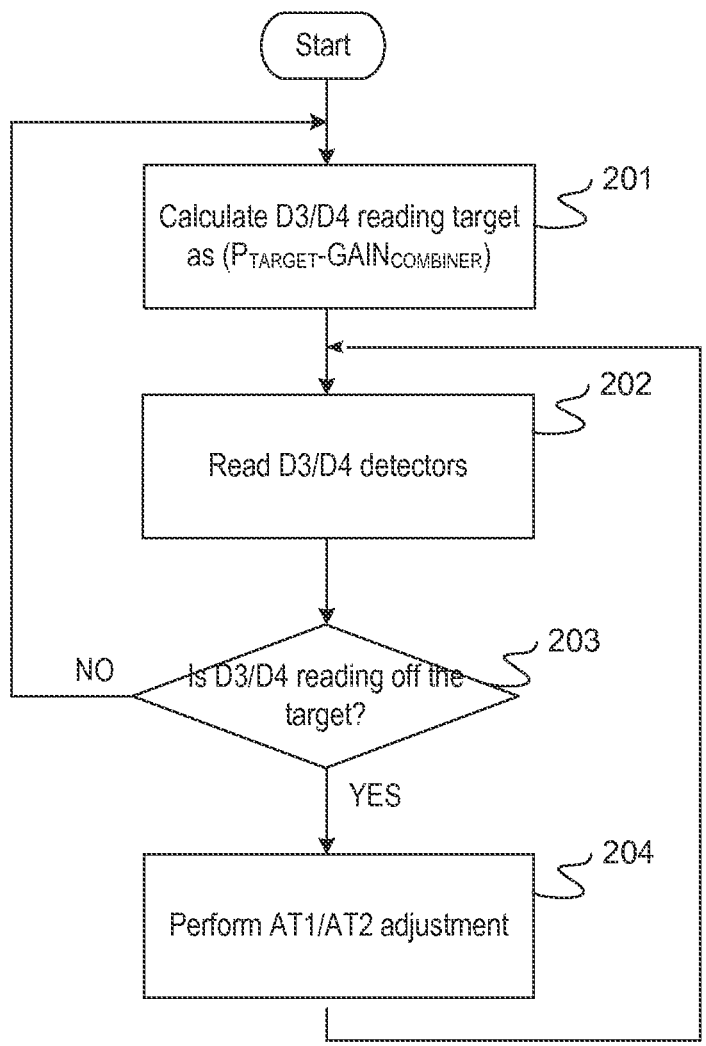
FIG. 2 is an exemplary flowchart illustrating a method performed by each of the two radio units for maintaining its output at a predefined output power level in accordance with some embodiments of the present application.

FIG. 2 is an exemplary flowchart illustrating a method performed by each output power control loop for maintaining the corresponding transmitter's output at a predefined output power level in accordance with some embodiments of the present application. The fact that the target output power level of the combiner 130 depends on the combination of the two inputs of the combiner 130 requires that each radio channel should satisfy its own power dynamic range characteristics, which makes it possible to determine the output power level at each transmitter based on the target output power level and the performance characteristics of the combiner 130. Assuming that the target output power level of the combiner 130 is $P_{TARGET}$ and the power gain of the combiner 130 is $GAIN_{COMBINER}$, the target reading of the detectors D3/D4 can be calculated (201) as ($P_{TARGET}$−$GAIN_{COMBINER}$). In other words, the predefined output power level at the transmitter (128-1, 128-2) should be defined as ($P_{TARGET}$−$GAIN_{COMBINER}$). As shown in FIG. 2, the output power control loop receives the actual reading (202) of the detectors D3/D4 and determines whether the actual reading matches (203) the target reading ($P_{TARGET}$−$GAIN_{COMBINER}$) at the output of the transmitter (128-1, 128-2). If the actual reading is off the target reading (203—Yes), the output power control loop performs (204) adjustment to the attenuator AT1/AT2 accordingly and then returns to get a new reading from the detector D3/D4 until when the actual reading by the detector D3/D4 meet the target ($P_{TARGET}$−$GAIN_{COMBINER}$).

In other words, the system 100 maintains each transmitter's output power at a predefined level by adjusting the attenuator AT1/AT2 based on the actual reading of the detector D3/D4. The accuracy and stability of the transmitter's output power level is achieved through calibration and using correction factors for temperature, bandwidth and frequency. The target reading at the detectors D3 and D4, maintained by these two control loops, is calculated based on the target output power at the combined output of the combiner 130 and taking in to account the actual gain of the combiner 130.

As described below in connection with FIG. 3, the output power control loops (135-1, 135-2) may begin with an initial estimate of the power gain of the combiner 130, $GAIN_{COMBINER}$, for calibrating the two attenuators. When the power gain of the combiner 130 is updated, the output power control loops (135-1, 135-2) needs to recalculate the target reading at the detector D3/D4 at step 201 and re-adjust the attenuator AT1/AT2 accordingly. Alternatively, when the target output power level at the combiner 130 changes, the output power control loops (135-1, 135-2) also needs to recalculate the target reading at the detector D3/D4 and re-adjust the attenuator AT1/AT2 accordingly.

Figure 5:
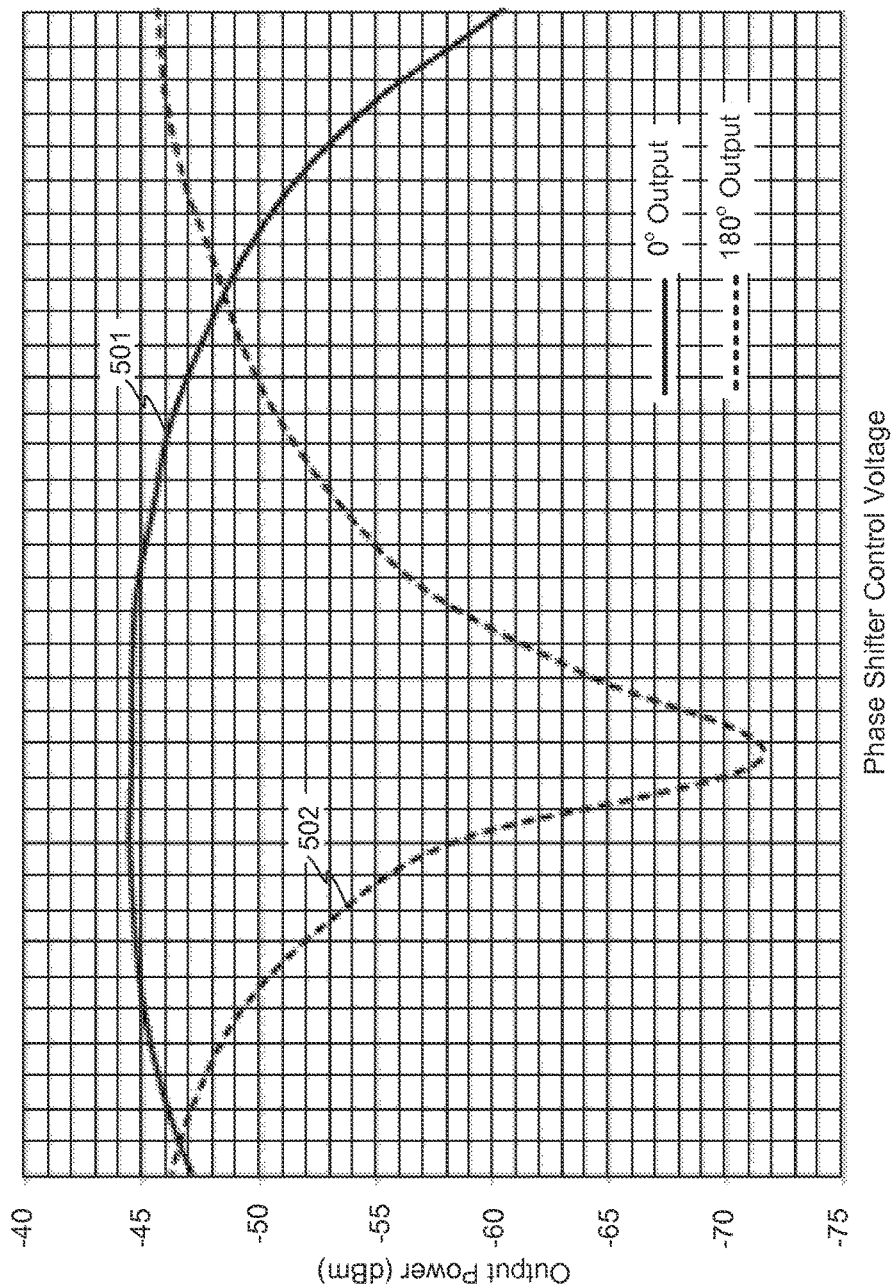
FIG. 5 illustrates a relationship between the 0-degree phase-shift RF output and the 180-degree phase-shift RF output of the digital microwave radio system in accordance with some embodiments of the present application.

Assuming that the output power control loops (135-1, 135-2) have maintained the two transmitters 120-1 and 120-2 at the predefined output power level, the system 100 then needs to re-adjust the adjustable phase shifter 123 using the phase error control loop 140 to minimize the output power level of the 180-degree phase-shift RF output. FIG. 5 illustrates a relationship between the 0-degree phase-shift RF output and the 180-degree phase-shift RF output of the digital microwave radio system 100 in accordance with some embodiments of the present application. In this example, the vertical axis presents the combined power level of the combiner 100. In particular, the solid-line curve 501 represents the combined power level of the 0-degree phase-shift RF output of the system 100 and the dashed-line curve 502 represents the combined power level of the 180-degree phase-shift RF output of the system 100. The horizontal axis represents the control voltage of the adjustable phase shifter 123, which corresponds to the phase error between the two inputs of the combiner 130. As shown in FIG. 5, the curve 501 has a wide flat top portion, indicating that the combined power level of the 0-degree phase-shift RF output is not very sensitive to the small phase error between the two input signals of the combiner 130. For example, the combined power level loss is less than 0.5 dB from its maximum value when the two input signals of the combiner 130 have a phase error less than 40°. On the other hand, even a small phase misalignment between two input signals can cause significant signal distortion to the combined output, i.e., 0-degree phase-shift RF output, and result in distortion of the recovered signal constellation in the receiver demodulator at the remote side of the radio link and higher residual bit error rate or even synchronization loss on the receiver side. Therefore, the precise phase alignment between the two input RF signals of the combiner 130 is critical for the efficiency and accuracy of the combining. By contrast, the portion of the curve 502 corresponding to the flat top of the curve 501 has a large curvature, indicating that the combined power level of the 180-degree phase-shift RF output is much more sensitive to the phase error between the two input signals and the combined power level of the 180-degree phase-shift RF output is minimized when the phase error is close to 180°. When the combined power level of the 180-degree phase-shift RF output is minimized, the combined power level of the 0-degree phase-shift RF output is maximized. Therefore, by monitoring the combined power level of the 180-degree phase-shift RF output using a power detector, the system 100 can achieve a better phase synchronization of the signals at the inputs of the combiner 130 and maximize the output power level of the combiner 130 at the 0° phase-shift output.

As shown in FIG. 1, the second layer of control loop combines the phase error control loop 140 and the combiner gain control loop 150. The phase error control loop 140 is closed by the detector D2, which provides reading of the combined power level of the 180-degree phase-shift RF output, and the adjustable phase shifter 123 (β). The phase error control loop 140 maintains the detector D2's reading at a minimum level by changing the phase shifter's control voltage. Note that the phase shifter adjustment is done after the output power control loops (135-1 and 135-2) have converged for both channels and the detectors D3/D4 reading are at the predefined output power level using the method described above in connection with FIG. 2.

After the phase error control loop 140 converges, the combiner gain control loop 150 recalculates the value of the power gain of the combiner 130 based on the difference between the combined power level of the 0-degree phase-shift RF output at the combined output port (i.e., the actual reading of the detector D1) and the power levels at the combiner's two inputs (i.e., the actual readings of the detectors D3 and D4). As noted above, the combiner's power gain may be updated by this process. When this happens, the combiner gain adjustment may result in an update to the predefined output power level read by the D3 and D4 detectors. Therefore, the output power control loops (135-1, 135-2) may need to perform the method depicted in FIG. 2 to maintain the updated predefined output power level at the combiner 130's two inputs, which then bring the actual combined power level at the combiner 130's 0-degree phase-shift output port to the target level.

Figure 3:
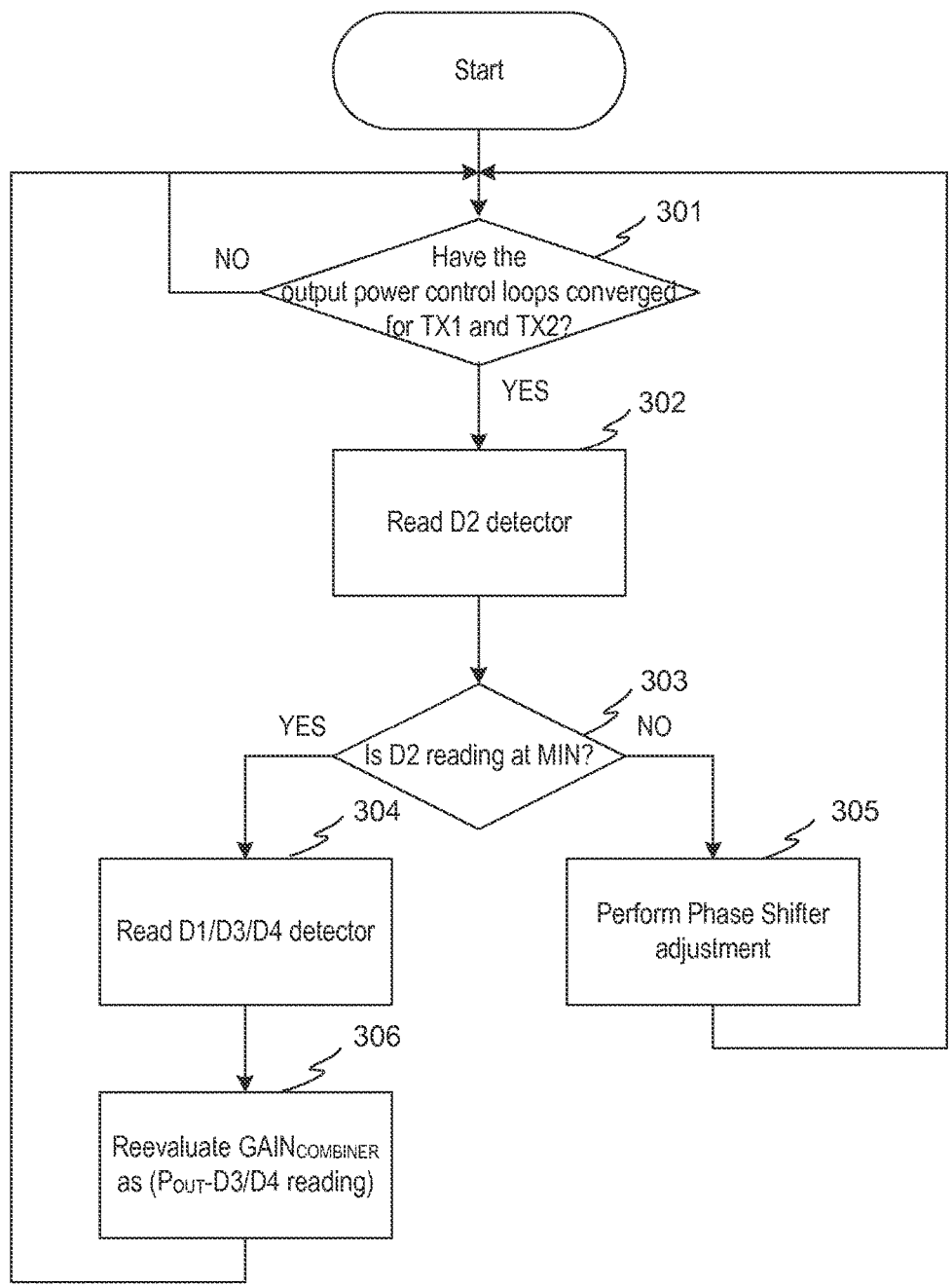
FIG. 3 is an exemplary flowchart illustrating a method performed by the digital microwave radio system for maintaining its 0-degree phase-shift RF output at a target output power level by minimizing the output power level of its 180-degree phase-shift RF output in accordance with some embodiments of the present application.

FIG. 3 is an exemplary flowchart illustrating a method performed by the digital microwave radio system 100 for maximizing the combined power level of its 0-degree phase-shift RF output at a target output power level by minimizing the output power level of its 180-degree phase-shift RF output in accordance with some embodiments of the present application. The system 100 first checks (301) whether the output power control loops (135-1, 135-2) have converged for both transmitters (120-1, 120-2). If not (301—NO), the system 100 returns to perform the method described in FIG. 2. Assuming that the two output power control loops have converged (301—YES), the phase error control loop 140 performs (302) a reading of the combined power level of the 180-degree phase-shift RF output using the detector D2 and compares the D2 reading with previous D2 readings to determine (303) whether the current reading is minimized as shown in FIG. 5. If not (303—NO), the phase error control loop 140 then performs (305) the phase shifter adjustment as described above and returns to step 301 because the phase shifter adjustment may disrupt the convergence at the two transmitters (120-1, 120-2). Otherwise (303—YES), the power detectors D3 and D4 perform a new reading of the output power levels of the two transmitters (120-1, 120-2) and power detector D1 performs a new reading of the actual combined power level ($P_{OUT}$) of the combiner 130 at the in-phase output port. Based on such readings, (120-1, 120-2) the combiner gain control loop 150 reevaluates (306) the power gain of the combiner, $GAIN_{COMBINER}$, as ($P_{OUT}$–D3/D4 reading). As noted above, the new power gain of the combiner needs to be applied to the two transmitters by the two output power control loops (135-1, 135-2). Therefore, the system 100 returns to perform the step 301.

Figure 4:
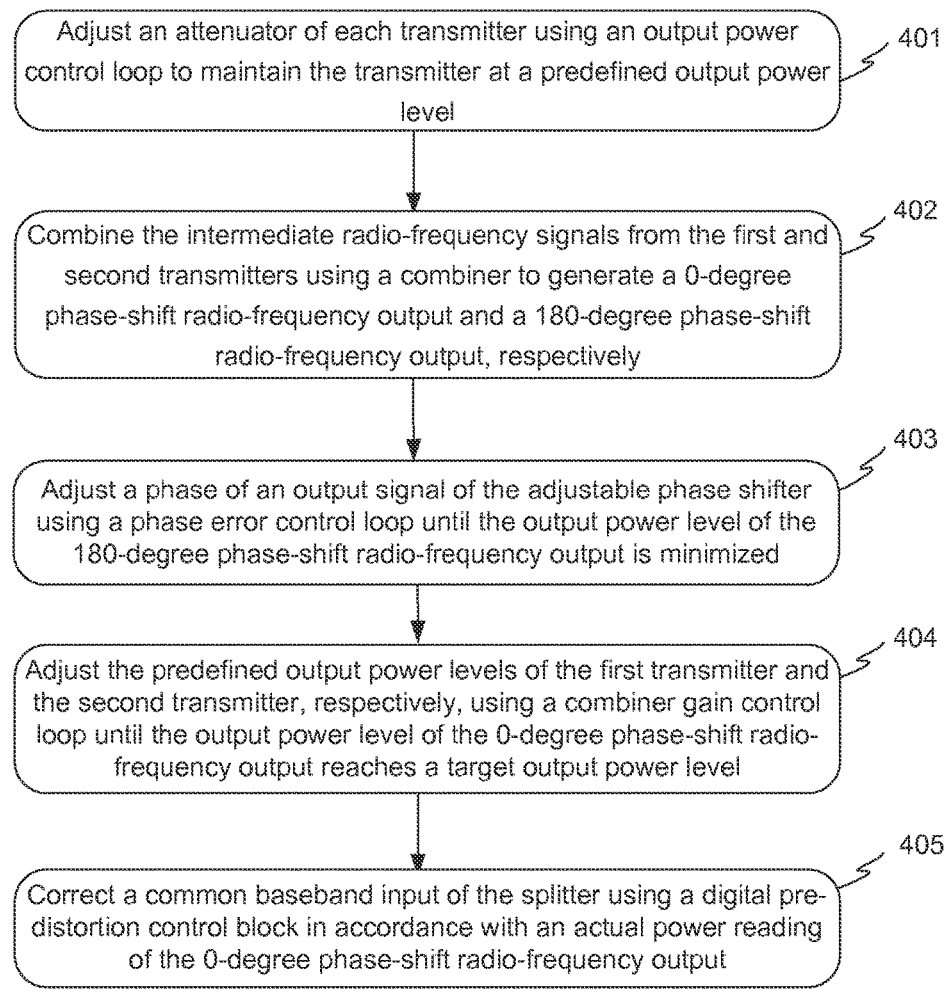
FIG. 4 is an exemplary flowchart illustrating a method performed by the digital microwave radio system for performing in-phase combination to two RF signals going through the two radio units in parallel in accordance with some embodiments of the present application.

FIG. 4 is an exemplary flowchart illustrating a method performed by the digital microwave radio system for performing in-phase combination to two RF signals going through the two radio units in parallel in accordance with some embodiments of the present application. The system includes a splitter, first and second transmitters coupled to the splitter, and a combiner coupled to the first and second transmitters. Each transmitter is configured to up-convert a baseband signal from the splitter to a corresponding radio-frequency signal and the combiner is configured to combine the two radio-frequency signals into one signal. A common local oscillator is electrically connected to a mixer of the first transmitter and a mixer of the second transmitter via an adjustable phase shifter, respectively.

The system first adjusts (401) an attenuator of each transmitter using an output power control loop (e.g., 135-1 135-2) to maintain the transmitter at a predefined output power level. In some embodiments, the output power control loop maintains the transmitter at the predefined output power level in accordance with an output of the combiner gain control loop. The system then combines (402) the radio-frequency signals from the first and second transmitters into a 0-degree phase-shift radio-frequency output and a 180-degree phase-shift radio-frequency output, respectively. The system adjusts (403) a phase of an output signal of the adjustable phase shifter using a phase error control loop until when the output power level of the 180-degree phase-shift radio-frequency output is minimized. For example, the phase error control loop is configured to change the control voltage of the adjustable phase shifter until when the output power level of the 180-degree phase-shift radio-frequency output is minimized. Finally, the system adjusts (404) the predefined output power levels of the first transmitter and the second transmitter, respectively, using a combiner gain control loop until when the output power level of the 0-degree phase-shift radio-frequency output reaches a target output power level. In some embodiments, the system further corrects (405) a common baseband input of the splitter using a digital pre-distortion control block in accordance with an actual combined signal at the 0-degree phase-shift radio-frequency output.

In some embodiments, the output of the combiner gain control loop may be determined by an actual reading of the 0-degree phase-shift radio-frequency output. In some embodiments, the predefined output power level of the transmitter is determined by a difference between a target output power level of the combiner and an estimated gain of the combiner. The estimated gain of the combiner is determined by a difference between an actual output power level of the combiner and an actual input power level of the combiner.

The terminology used in the description of the embodiments herein is for the purpose of describing particular embodiments only and is not intended to limit the scope of claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc. may be used herein to describe various elements, these elements should not be limited by these terms. These terms are only used to distinguish one element from another. For example, a first port could be termed a second port, and, similarly, a second port could be termed a first port, without departing from the scope of the embodiments. The first port and the second port are both ports, but they are not the same port.

As used herein, the terms "couple," "coupling," and "coupled" are used to indicate that multiple components are connected in a way such that a first component of the multiple components is capable of receiving a signal from a second component of the multiple components, unless indicated otherwise. In some cases, two components are indirectly coupled, indicating that one or more components (e.g., filters, waveguides, etc.) are located between the two components but a first component of the two components is capable of receiving signals from a second component of the two components.

As used herein, "mechanically coupling" indicates that components are structurally connected. However, mechanically coupled components are not necessarily configured to send and receive signals between them.

Many modifications and alternative embodiments of the embodiments described herein will come to mind to one skilled in the art having the benefit of the teachings presented in the foregoing descriptions and the associated drawings. Therefore, it is to be understood that the scope of claims are not to be limited to the specific examples of the embodiments disclosed and that modifications and other embodiments are intended to be included within the scope of the appended claims. Although specific terms are employed herein, they are used in a generic and descriptive sense only and not for purposes of limitation.

The foregoing description, for purpose of explanation, has been described with reference to specific embodiments. However, the illustrative discussions above are not intended to be exhaustive or to limit the scope of claims to the precise forms disclosed. Many modifications and variations are possible in view of the above teachings. The embodiments were chosen and described in order to best explain the underlying principles and their practical applications, to thereby enable others skilled in the art to best utilize the underlying principles and various embodiments with various modifications as are suited to the particular use contemplated.

We claim:

1. A digital microwave radio system comprising:
   a splitter that splits a common baseband input into two baseband outputs;
   a first transmitter and a second transmitter, each transmitter being electrically connected to a baseband output of the splitter via a mixer;
   a common local oscillator that is electrically connected to the mixer of the first transmitter directly and electrically connected to the mixer of the second transmitter via an adjustable phase shifter, respectively, wherein the common local oscillator is configured to up-convert each baseband output of the splitter into a radio-frequency signal using a corresponding mixer;
   a combiner that combines the two radio-frequency signals into a 0-degree phase-shift radio-frequency output and a 180-degree phase-shift radio-frequency output, respectively;
   a phase error control loop that adjusts the adjustable phase shifter in accordance with an actual reading of the 180-degree phase-shift radio-frequency output; and
   a combiner gain control loop that adjusts output power level of the first transmitter and the second transmitter in accordance with an actual power detector reading of the 0-degree phase-shift radio-frequency output.

2. The digital microwave radio system of claim 1, further comprising:
   a digital pre-distortion control block that applies the actual reading of the 0-degree phase-shift radio-frequency output to the common baseband input of the splitter.

3. The digital microwave radio system of claim 1, wherein each transmitter further includes an output power control loop that maintains the transmitter at a predefined output power level in accordance with an output of the combiner gain control loop.

4. The digital microwave radio system of claim 3, wherein the output of the combiner gain control loop is determined by the actual power detector reading of the 0-degree phase-shift radio-frequency output.

5. The digital microwave radio system of claim 3, wherein the predefined output power level of the transmitter is determined by a difference between a target output power level of the combiner and an estimated gain of the combiner.

6. The digital microwave radio system of claim 5, wherein the estimated gain of the combiner is determined by a difference between an actual output power level of the combiner and an actual input power level of the combiner.

7. The digital microwave radio system of claim 1, wherein the phase error control loop is configured to change a control voltage of the adjustable phase shifter until when the output power level of the 180-degree phase-shift radio-frequency output is minimized.

8. A method of performing in-phase combining two radio-frequency signals from first and second transmitters of a digital microwave radio system, wherein each transmitter is configured to up-convert a baseband signal from a splitter to a corresponding radio-frequency signal and a common local oscillator is electrically connected to a mixer of the first transmitter directly and electrically connected to a mixer of the second transmitter via an adjustable phase shifter, respectively, the method comprising:
   adjusting an attenuator of each transmitter using an output power control loop to maintain the transmitter at a predefined output power level;
   combining the radio-frequency signals from the first and second transmitters using a combiner to generate a 0-degree phase-shift radio-frequency output and a 180-degree phase-shift radio-frequency output, respectively;
   adjusting an output signal of the adjustable phase shifter using a phase error control loop until when the output power level of the 180-degree phase-shift radio-frequency output is minimized; and
   adjusting the predefined output power levels of the first transmitter and the second transmitter, respectively, using a combiner gain control loop until when the output power level of the 0-degree phase-shift radio-frequency output reaches a target output power level.

9. The method of claim 8, further comprising:
   correcting a common baseband input of the splitter using a digital pre-distortion control block in accordance with an actual power detector reading of the 0-degree phase-shift radio-frequency output.

10. The method of claim 8, wherein the output power control loop maintains the transmitter at the predefined output power level in accordance with an output of the combiner gain control loop.

11. The method of claim 10, wherein the output of the combiner gain control loop is determined by the actual power detector reading of the 0-degree phase-shift radio-frequency output.

12. The method of claim 10, wherein the predefined output power level of the transmitter is determined by a difference between a target output power level of the combiner and an estimated gain of the combiner.

13. The method of claim 12, wherein the estimated gain of the combiner is determined by a difference between an actual output power level of the combiner and an actual input power level of the combiner.

14. The method of claim 8, wherein the phase error control loop is configured to change a control voltage of the adjustable phase shifter until when the output power level of the 180-degree phase-shift radio-frequency output is minimized.

* * * * *